(12) United States Patent
Zhang

(10) Patent No.: US 11,391,419 B2
(45) Date of Patent: Jul. 19, 2022

(54) EXPANDABLE LIGHT BAR SYSTEM

(71) Applicant: Bruce Zhang, Orlando, FL (US)

(72) Inventor: Bruce Zhang, Orlando, FL (US)

(73) Assignee: Everylite, Orlando, FL (US)

( * ) Notice: Subject to any disclaimer, the term of this patent is extended or adjusted under 35 U.S.C. 154(b) by 0 days.

(21) Appl. No.: 16/892,005

(22) Filed: Jun. 3, 2020

(65) Prior Publication Data

US 2021/0381660 A1 Dec. 9, 2021

(51) Int. Cl.
F21K 9/272 (2016.01)
H01L 27/15 (2006.01)
F21K 9/275 (2016.01)

(52) U.S. Cl.
CPC .............. *F21K 9/272* (2016.08); *F21K 9/275* (2016.08); *H01L 27/153* (2013.01)

(58) Field of Classification Search
CPC .... F21V 21/005; F21V 23/06; F21Y 2107/70; F21K 9/65; F21S 4/22; F21S 4/24; F21S 4/26; F21S 4/28
See application file for complete search history.

(56) References Cited

U.S. PATENT DOCUMENTS

| | | | |
|---|---|---|---|
| 8,454,204 B1 | 6/2013 | Chang et al. | |
| 9,337,598 B1 | 5/2016 | Baright | |
| 10,208,933 B1 * | 2/2019 | Seligman | F21V 21/025 |
| 2008/0259615 A1 * | 10/2008 | Chien | F21S 4/28 |
| | | | 362/382 |
| 2010/0254131 A1 * | 10/2010 | Coushaine | F21V 33/006 |
| | | | 362/233 |
| 2010/0277917 A1 | 11/2010 | Shan | |
| 2013/0107537 A1 | 5/2013 | Lee et al. | |
| 2013/0182440 A1 | 7/2013 | Feme et al. | |
| 2014/0036505 A1 | 2/2014 | Barton | |
| 2014/0063803 A1 * | 3/2014 | Yaphe | F21V 15/013 |
| | | | 362/247 |
| 2014/0071668 A1 * | 3/2014 | Ai | F21V 21/005 |
| | | | 362/219 |
| 2014/0078731 A1 | 3/2014 | Harruff | |
| 2015/0016149 A1 | 1/2015 | Cohade et al. | |
| 2015/0267899 A1 | 9/2015 | Baright | |
| 2015/0364853 A1 * | 12/2015 | Thijssen | F21V 23/06 |
| | | | 439/660 |
| 2016/0215942 A1 | 7/2016 | Hughes et al. | |
| 2017/0051881 A1 | 2/2017 | Chamberlain | |

(Continued)

*Primary Examiner* — Andrew J Coughlin
(74) *Attorney, Agent, or Firm* — Jason T. Daniel, Esq.; Daniel Law Offices, P.A.

(57) ABSTRACT

An expandable light bar system includes a plurality of light bar segments each having an elongated hollow body and a lighting unit. Each lighting unit includes a housing with a plurality of light emitting diodes that are electrically connected to either a subsequent lighting unit or a power source. The housing is secured onto a ridge that is located along the top surface of the elongated body. An expansion adaptor is positioned between two light bar segments and allows the overall length of the joined light bar segments to be adjustable. A spacer is positioned at the center of the adaptor and defines a minimum separation distance between the segments. A pair of endcaps are removably secured to one end of each of the light bar segments and are configured to engage an existing fluorescent high output socket within a light box to support placement of the joined segments.

17 Claims, 6 Drawing Sheets

(56) References Cited

U.S. PATENT DOCUMENTS

| | | |
|---|---|---|
| 2017/0146226 A1 | 5/2017 | Storey et al. |
| 2017/0152996 A1 | 6/2017 | Fujita et al. |
| 2017/0198868 A1 | 7/2017 | Scapa et al. |
| 2018/0135849 A1 | 5/2018 | Paseta |
| 2018/0149320 A1 | 5/2018 | Mitsuzuka et al. |

* cited by examiner

EXPANDABLE LIGHT BAR SYSTEM

TECHNICAL FIELD

The present invention relates generally to light bar assemblies, and more particularly to an expandable light bar system.

BACKGROUND

The statements in this section merely provide background information related to the present disclosure and may not constitute prior art.

Light box-type signs are frequently employed in advertising in order to attract the attention of potential customers. Conventional light box signs have one or more fluorescent tubes mounted inside the box behind a translucent cover bearing a business name or other advertising material. Fluorescent tubes, however, contain mercury which is a hazard to living organisms and their environment. Moreover, the tubes have a limited lifetime, necessitating frequent, time-consuming and labor-intensive maintenance. Other light types offer improvements over fluorescent tubes. Light emitting diodes (LED's), for example, are a more energy efficient and environmentally friendly alternative. LEDs, moreover, generally have longer effective lives than fluorescent tubes, thus reducing maintenance time and cost.

Although many newer style light box signs are constructed with LED lamps as an integral component, the process for upgrading existing fluorescent-style boxes has been met with limited success. This is because there is no industry standard shape or size for such assemblies. As a result, companies attempting to retrofit these boxes must either construct custom light bars having a shape and size that is specific to the box for which it is to be installed, or they must physically modify an elongated light bar to fit the box. This modification typically includes cutting the length of the light bar and rewiring the lights.

The present invention, directed to an expandable light bar system, differs from the conventional art in a number of aspects. The manner by which will become more apparent in the description which follows, particularly when read in conjunction with the accompanying drawings.

SUMMARY OF THE INVENTION

The present invention is directed to an expandable light bar system. One embodiment of the present invention can include a plurality of light bar segments each having an elongated hollow body and at least one lighting unit. Each of the lighting units can include a housing for supporting a plurality of light emitting diodes that are electrically connected to either a subsequent lighting unit or a power source. The housing is preferably secured onto a ridge that is located along the top surface of the elongated body.

An expansion adaptor can be positioned between two light bar segments. The expansion adaptor allows the overall length of the joined light bar segments to be adjustable, and a spacer that is positioned along the center of the expansion adaptor can define a minimum separation distance between the segments.

In one embodiment, the system can also include one or a pair of endcaps that can be removably secured to one or both ends of the light bar segments. The endcaps can include a distal portion having a shape and size that is capable of engaging an existing fluorescent high output socket within a light box.

This summary is provided merely to introduce certain concepts and not to identify key or essential features of the claimed subject matter.

BRIEF DESCRIPTION OF THE DRAWINGS

Presently preferred embodiments are shown in the drawings. It should be appreciated, however, that the invention is not limited to the precise arrangements and instrumentalities shown.

DETAILED DESCRIPTION OF THE INVENTION

Figure 1:
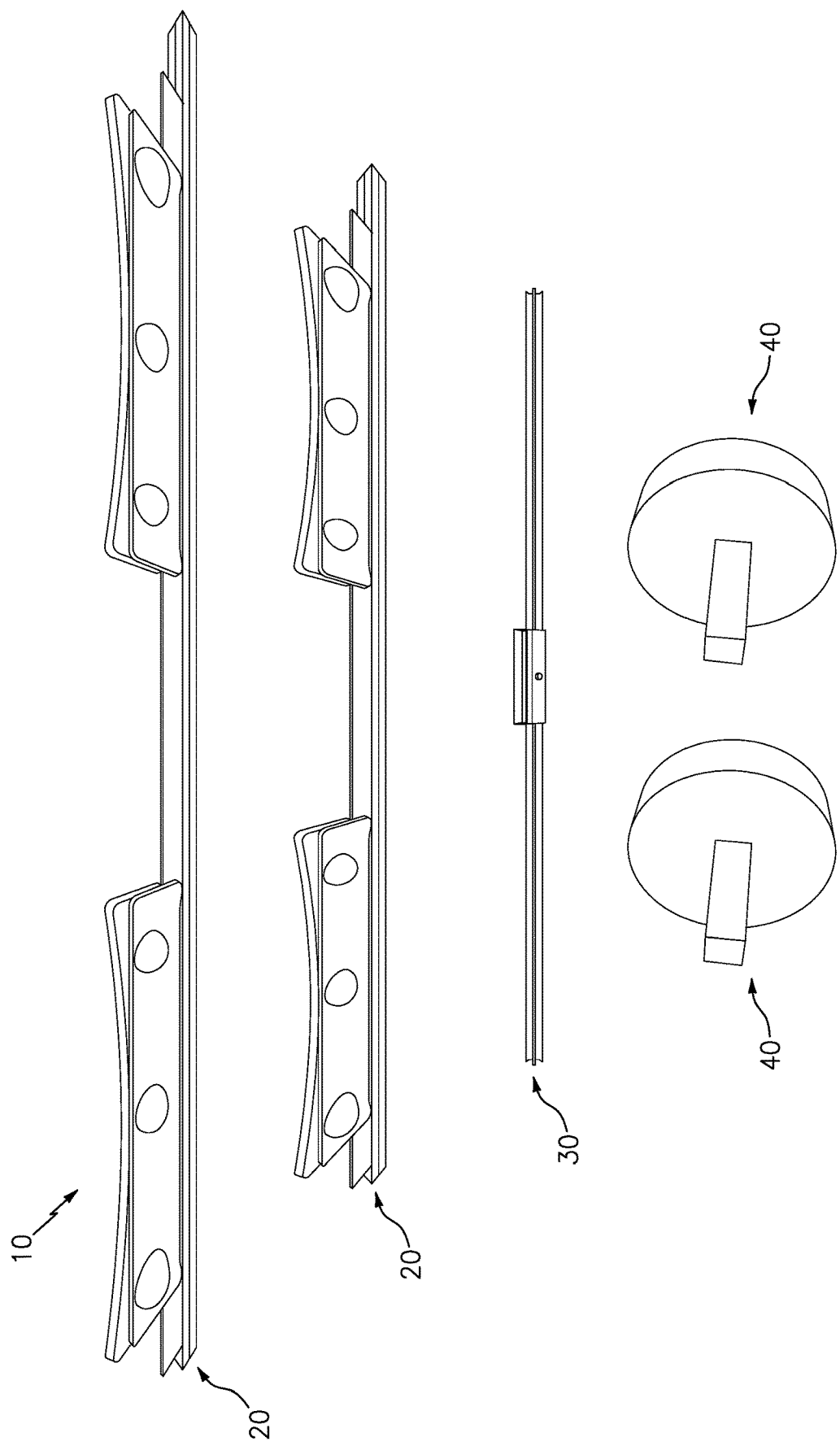
FIG. 1 is an exploded parts view of an expandable light bar system that is useful for understanding the inventive concepts disclosed herein.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

As described herein, a "connector" can include any number of different elements capable of securing two items together in either a permanent or a nonpermanent manner. Several nonlimiting examples of a nonpermanent connector include, for example, opposing strips of hook and loop material (i.e. Velcro®), magnetic elements, tethers such as straps and zip ties, as well as compression fittings such as screws, nuts, bolts and other such hardware. Several nonlimiting examples of permanent connectors include adhesives such as glue and resin, welds and rivets, for example.

As described throughout this document, the term "complementary shape," and "complementary dimension," shall be used to describe a shape and size of a component that is identical to, or substantially identical to the shape and size of another identified component.

FIGS. 1-5 illustrate one embodiment of an expandable light bar system 10 that are useful for understanding the inventive concepts disclosed herein. In each of the drawings, identical reference numerals are used for like elements of the invention or elements of like function. For the sake of clarity, only those reference numerals are shown in the individual figures which are necessary for the description of the respective figure. For purposes of this description, the terms "upper," "bottom," "right," "left," "front," "vertical," "horizontal," and derivatives thereof shall relate to the invention as oriented in FIG. 1.

As shown in FIG. 1, the system 10 can include, essentially a plurality of light bar segments 20, at least one expansion adaptor 30 and one or more end caps 40.

Figure 2:
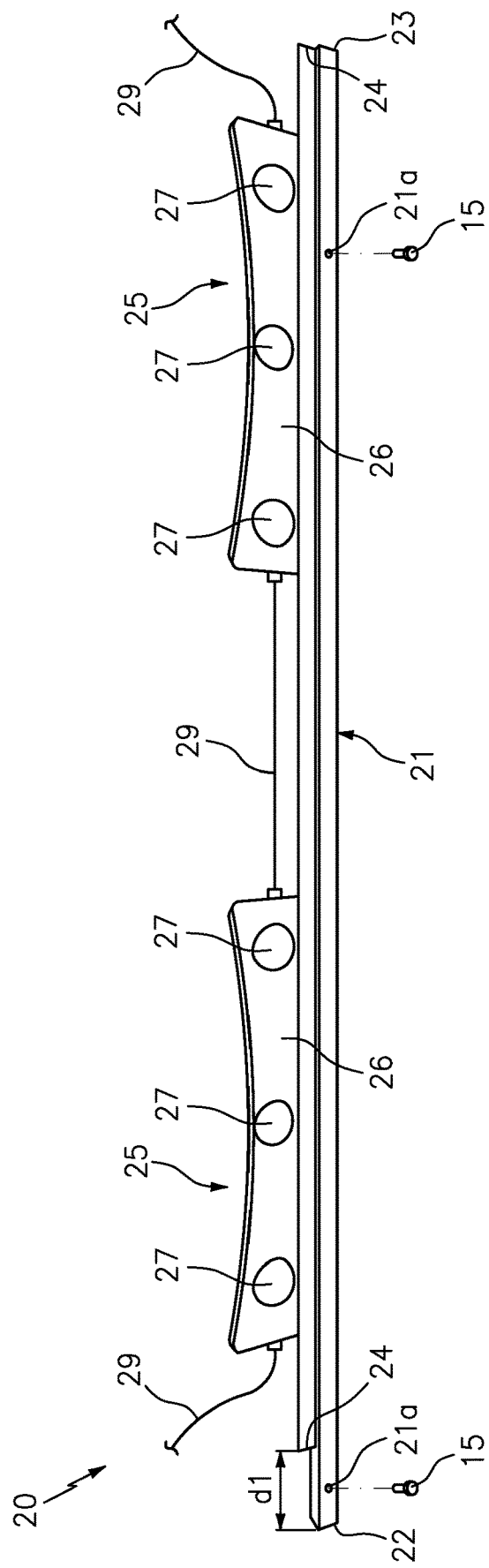
FIG. 2 is a side view of a light bar segment of the expandable light bar system, in accordance with one embodiment of the invention.

FIG. 2 illustrates one embodiment of a light bar segment 20. As shown, each segment can include an elongated hollow main body member 21 having an open first end 22, and an open second end 23. One or more apertures 21a can be positioned along the length of the main body member and can be engaged by connectors 15 such as setscrews, for example, in order to secure the main body onto the below described expansion adaptor. An elongated ridge 24 can be positioned along the top end of the main body, and can extend from the edge of the second end 23 to a location that is a first distance dl from the first end 22.

In the preferred embodiment, the main body and the ridge can be constructed from a single piece of extruded aluminum, with the main body section forming the illustrated hollow-square tube shape. Of course, the main body and ridge may also include any number of other shapes and sizes, and may be formed from any number of materials that are, for example, relatively strong and stiff for their weight. Several nonlimiting examples include, but are not limited to various metals or metal alloys (e.g., aluminum, steel, titanium, or alloys thereof), plastic/polymers (e.g., high-density polyethylene (HDPE) or polyethylene terephthalate (PET)), and/or various composite materials (e.g., carbon fibers in a polymer matrix, fiberglass, etc.).

As shown, a pair of lighting units 25 can be provided along the top end of the main body 21. The lighting units can include a housing 26 into which a plurality of light producing elements 27 can be located. The housing can be permanently secured to the ridge via rivets or other such devices, for example, so that no part of the lighting units are located within the hollow interior space of the main body 21. Finally, the lighting units can include any number of electrical connectors 29 such as wires, for example, so as to allow each lighting unit to be electrically connected to another lighting unit, or to a control/power unit of the cabinet into which the system is being installed.

In the preferred embodiment, the housings 26 can be constructed from a lightweight non-electrically conductive material such as plastic, for example, and the light producing elements 27 can comprise light emitting diodes (LEDs), for example. Of course any number of other housing materials and/or type of light producing elements can be utilized herein. To this end, one or more of the light producing elements may not have an optic lens on top of the diode.

Figure 3:
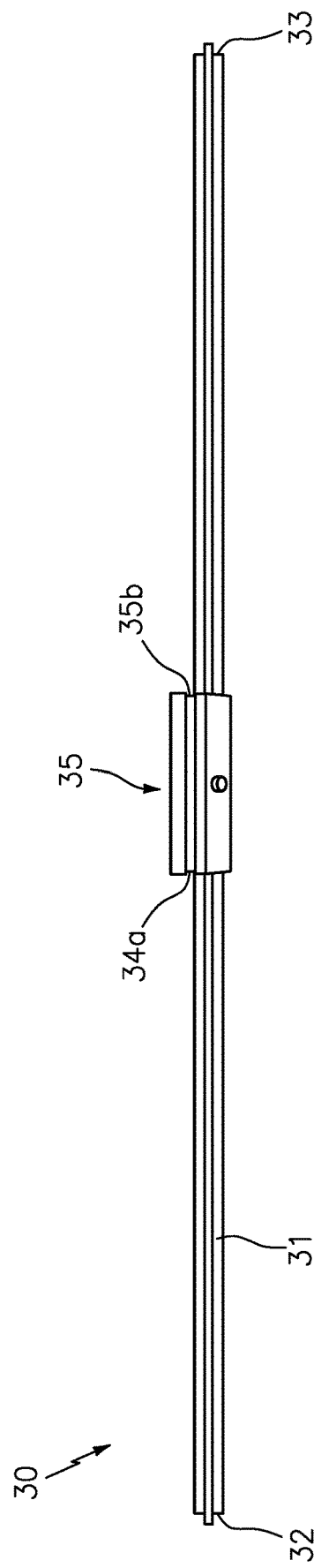
FIG. 3 is a side view of an expansion adaptor of the expandable light bar system, in accordance with one embodiment of the invention.

FIG. 3 illustrates one embodiment of an expansion adaptor 30 that includes an elongated planar shaft 31 having a first end 32, a second end 33 and a spacer 35. The elongated shaft 31 can include any number of different shapes and sizes that are complementary to/suitable for being positioned within the hollow interior space of the main body 21, or that can be secured along the outside surface of the main body 21.

The spacer 35 can include any number of different shapes, sizes and materials having a first end 35a and a second end 35b. The spacer can be positioned at the center of the planar shaft 31, and can function to support and maintain a minimum separation distance between the light bar segments. With the spacer fully inserted it meets the nominal length of a standard fluorescent tube. Using the spacer but not fully inserted the embodiments can be spaced further apart to increase the length of the system.

Figure 4A:
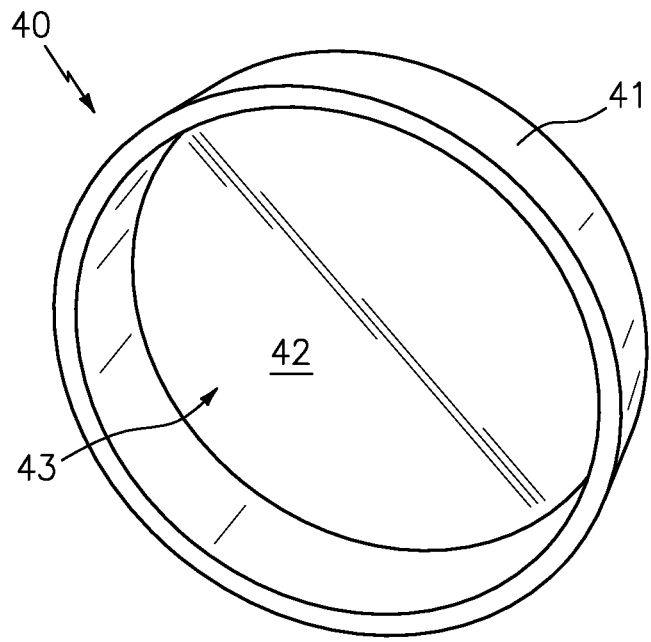
FIG. 4A is a bottom view of an endcap of the expandable light bar system, in accordance with one embodiment of the invention.
Figure 4B:
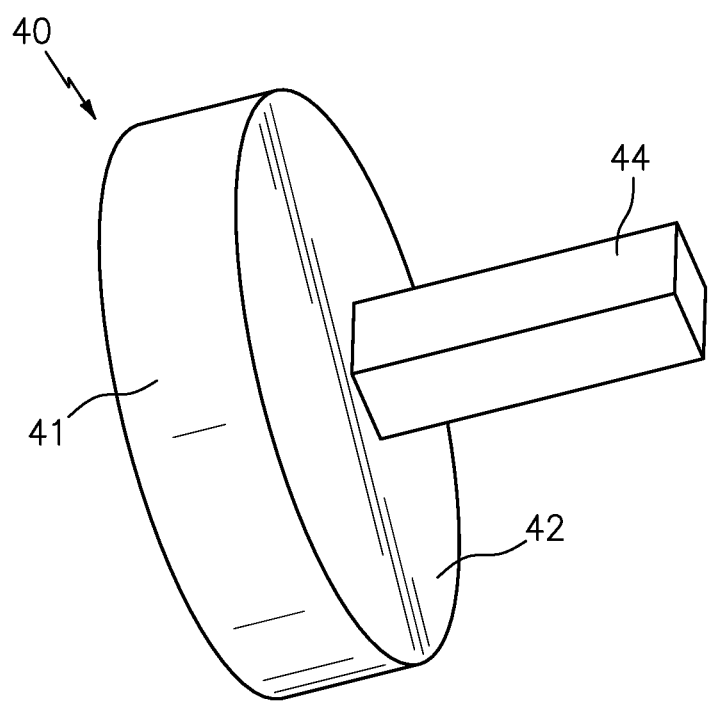
FIG. 4B is a perspective view of an endcap of the expandable light bar system, in accordance with one embodiment of the invention.

FIGS. 4A and 4B illustrate one embodiment of an endcap 40 for use with the system. As shown, each endcap can include a generally cylindrical-shaped cap that is defined by a continuous outer wall 41 and a back wall 42 that define a hollow interior space 43. An elongated shaft 44 can extend outward from the back wall 42 in a direction opposite to the interior space 43.

In the preferred embodiment, the endcap 40 can be constructed from a lightweight non-electrically conductive material such as plastic, for example, and the outer wall 41 will include a size that is complementary to the size of a traditional High Output (HO) socket. Such features are designed to allow the socket to be positioned within the hollow interior space 43 of the endcap, and for the endcap to function as an insulator, thereby preventing an electrical shock. Likewise, the shaft 44 can include a shape and size that is complementary to/suitable for being positioned within the first end of the main body 22. Of course, any number of other shapes and sizes are contemplated for allowing the endcaps to engage different types of sockets or other such devices within a light box cabinet.

Figure 5:
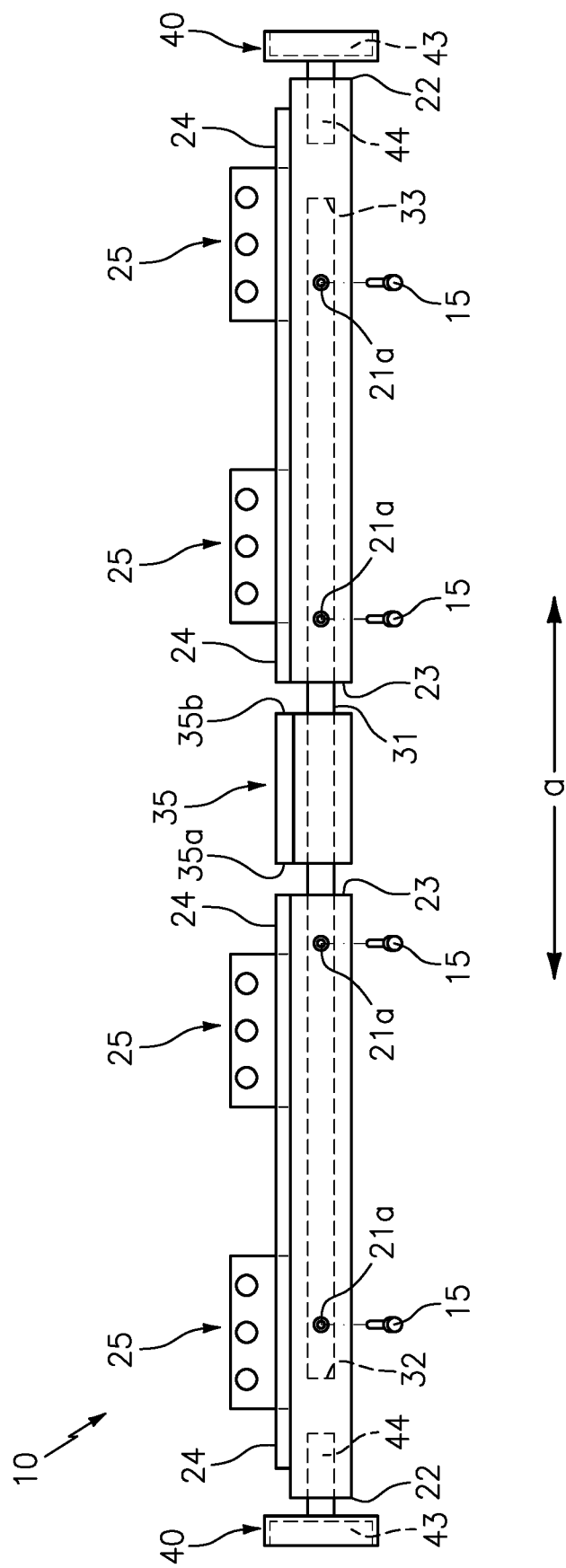
FIG. 5 is a side view of an assembled light bar of the expandable light bar system, in accordance with one embodiment of the invention.

FIG. 5 illustrates one embodiment of the assembled system 10. As shown, both ends 32 and 33 of the adaptor 30 can be telescopically positioned within the open second ends 23 of a pair of light bar segments. Additionally, the shafts 44 of the endcaps 40 can be secured within the open first ends 22 of the pair of light bar segments. When so positioned, the system forms a single elongated light bar having an adjustable length (see arrow a).

Although described above as including two segments 20 and a single expansion adaptor 30, this is for illustrative purposes only. To this end, the system contemplates the serial connection of any number of light bar segments and expansion adaptors to create single light bars having any length. Moreover, each individual light bar segment 20 may include a different length and/or number of lighting units 25 than another light bar segment that are connected by the one or more expansion adaptor(s) 30.

While dimensions are not critical, in the preferred embodiment, the main body member 21 can include a length (e.g., distance between ends 22 and 23) of approximately 22 cm to 152 cm, and the inside dimension of the square tubing can include a width/height of approximately 0.6 cm to 1 cm.

Likewise, the elongated shaft 31 of the expansion adaptor can include a length (e.g., distance between ends 32 and 33) of approximately 1 cm to 50 cm, and the spacer 35 can include a length (e.g., distance between ends 35a and 35b) of 0.01 cm to 6 cm. Such dimensions allow the system to fit cabinets requiring light bars between 22 cm and 152 cm, which are among the most commonly produced sizes.

Additionally, the endcap 41 can include a diameter of approximately 4.45 cm, and a depth (e.g., distance between the outer edge of the wall 41 and the back wall 42) of approximately 0.875 cm. Such dimensions being suitable for allowing the endcap to receive and engage a traditional HO socket.

Figure 6:
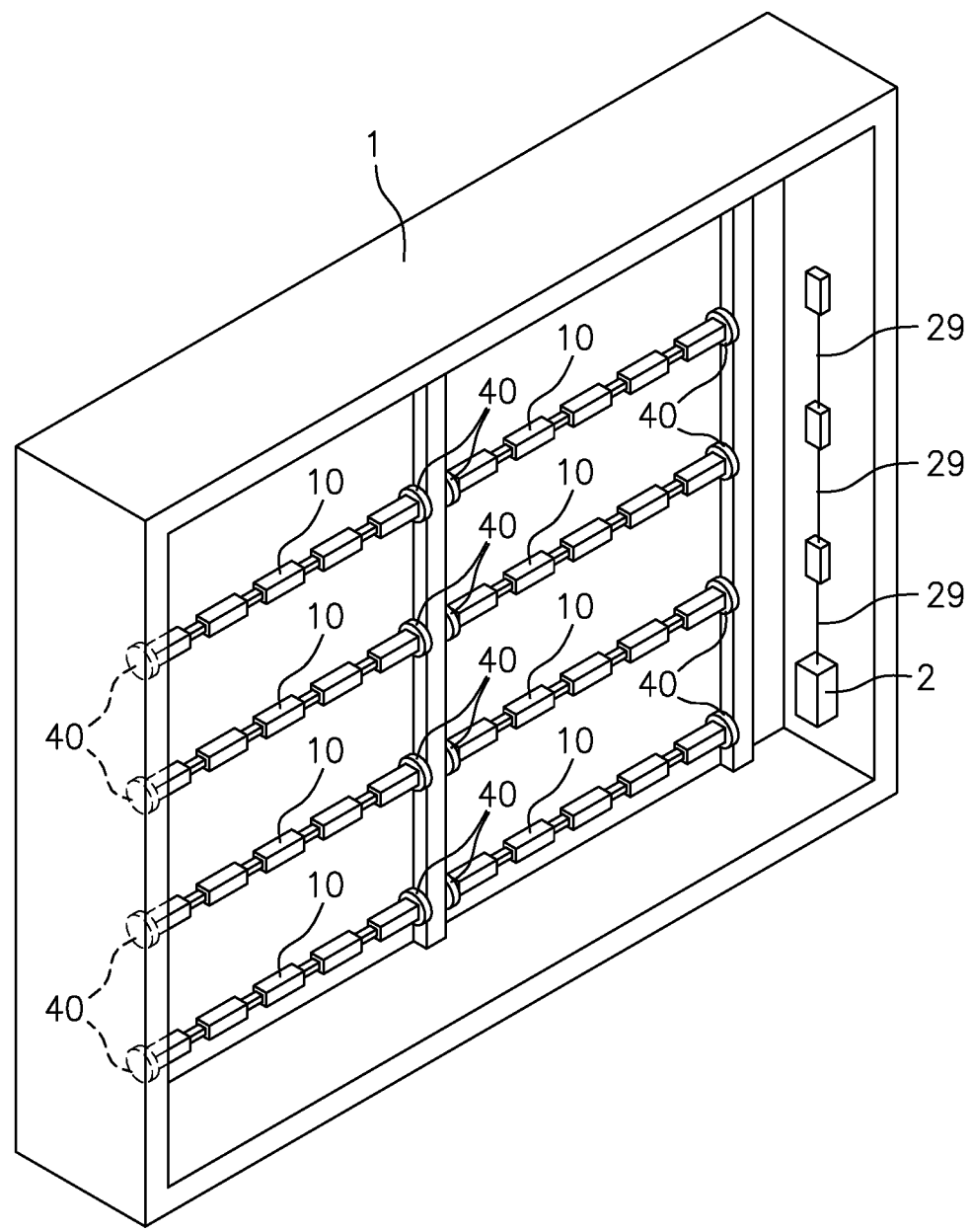
FIG. 6 is a perspective view of the expandable light bar system in operation, in accordance with one embodiment of the invention.

FIG. 6, illustrates one embodiment of the expandable light bar system 10 in operation. As shown, a plurality of assembled devices 10 can be positioned within the cabinet of an existing light box 1, by positioning one of the endcaps 40 over the existing HO socket, and then adjusting the length of the segments until the second endcap is positioned over the other endcap for the row. When so positioned, the user can lock the length of the device via the above described apertures and connectors, in order to prevent the length of the device from shifting in the future. Finally, the user can connect the wires 29 to the control/power supply unit 2 of the light box, in order to allow the unit to selectively illuminate each row of devices 10.

Although described above as utilizing a pair of endcaps, the inventive concepts disclosed herein are not so limiting. To this end, the design of the system contemplates use with a single endcap or without using the endcaps at all. In such an embodiment, the inside dimension of the square tubing can include a width/height of approximately 0.1 cm to 6 cm, and the distance dl will be 3 cm from the first end 22 of each the main body. Such dimensions are critical for allowing the first end 22 of each light bar to be positioned within the circular housing of an existing High Output (HO) socket and to ensure the central pin of the socket can be inserted into the open first end without interference from the ridge 24. This arrangement suspends the light bar within the box, without requiring additional mounting hardware. Moreover, this arrangement can also be utilized for securing the system within brand new light boxes, having a series of protrusions that are arranged along the side walls of the box that can engage the open first end 22 of each light bar.

As described herein, one or more elements of the light bar system 10 can be secured together utilizing any number of known attachment means such as, for example, screws, glue, compression fittings and welds, among others. Moreover, although the above embodiments have been described as including separate individual elements, the inventive concepts disclosed herein are not so limiting. To this end, one of skill in the art will recognize that one or more individually identified elements may be formed together as one or more continuous elements, either through manufacturing processes, such as welding, casting, or molding, or through the use of a singular piece of material milled or machined with the aforementioned components forming identifiable sections thereof.

As to a further description of the manner and use of the present invention, the same should be apparent from the above description. Accordingly, no further discussion relating to the manner of usage and operation will be provided.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Likewise, the terms "consisting" shall be used to describe only those components identified. In each instance where a device comprises certain elements, it will inherently consist of each of those identified elements as well.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. An expandable light bar system, comprising:
a plurality of light bar segments, each light bar segment including an elongated body having a first end, and a second end;
at least one lighting unit that is secured to each of the plurality of light bar segments and is configured to be connected to a power supply;
an expansion adaptor that is configured to connect two of the plurality of light bar segments together telescopically; and
at least one endcap that is removably secured to one of the plurality of light bar segments, each of the at least one endcap being constructed to be electrically nonconductive,
wherein each of the at least one endcap includes a continuous outer wall and a back wall that define a hollow interior space, and
wherein the hollow interior space of each of the at least one endcap includes a shape and a size that is complementary to a shape and a size of a high output socket of a light box sign.

2. The system of claim 1, wherein the elongated body of each of the plurality of light bar segments includes a hollow interior, and each of the first and second ends include openings for accessing the hollow interior.

3. The system of claim 2, wherein the expansion adaptor comprises:
an elongated shaft having a pair of ends and a center point, wherein the elongated shaft includes a size that is complementary to a size of the hollow interior, and each of the pair of ends of the elongated shaft are configured to be positioned within the opening located on the second end of each of the plurality of light bar segments.

4. The system of claim 3, further comprising:
a spacer that is positioned at the center point of the elongated shaft, said spacer being configured to maintain a minimum separation distance between two light bar segments that are connected to the elongated shaft.

5. The system of claim 3, further comprising:
at least one aperture that is positioned along the elongated body of each of the plurality of light bar sections; and
at least one connector that is configured to selectively engage the at least one aperture to secure the light bar section to the expansion adaptor.

6. The system of claim 1, further comprising:
an elongated ridge extending upward from one side of the elongated body of each of the plurality of light bar sections.

7. The system of claim 6, wherein each of the plurality of lighting units are secured to the elongated ridge.

8. The system of claim 1, wherein each of the lighting units comprise:
a plurality of light producing elements;
a housing for supporting each of the plurality of light producing elements; and an electrical connector that is in communication with each of the light producing elements.

9. The system of claim 8, wherein each of the light producing elements comprise light emitting diodes.

10. The system of claim 1, wherein the plurality of light bar segments comprises two light bars each having an identical length.

11. The system of claim 1, wherein the plurality of light bar segments comprises two light bars each having a different length.

12. The system of claim 1, wherein each of the at least one endcap is configured to receive and position the high output socket within the hollow interior space and to electrically isolate the received high output socket.

13. The system of claim 12, further comprising:
an electrical connection that is positioned between each of the plurality of lighting units, said electrical connection being located apart from and separate from the elongated body of each of the light bar segments.

14. The system of claim 1, further comprising:
a protrusion that extends outward from the back wall of each of the at least one endcap.

15. The system of claim 14, wherein the protrusion includes a shape and a size that is configured to a shape and a size of the opening along each of the first and second ends of each of the plurality of light bar segments.

16. An expandable light bar system, comprising:
a plurality of light bar segments, each light bar segment including an elongated body having a first end, and a second end;
at least one lighting unit that is secured to each of the plurality of light bar segments and is configured to be connected to a power supply;
an expansion adaptor that is configured to connect two of the plurality of light bar segments together telescopically;
at least one endcap that is removably secured to one of the plurality of light bar segments, each of the at least one endcap being constructed to be electrically nonconductive; and
a protrusion that extends outward from the back wall of each of the at least one endcap,
wherein the elongated body of each of the plurality of light bar segments includes a hollow interior, and each of the first and second ends include openings for accessing the hollow interior.

17. An expandable light bar system, comprising:
a plurality of light bar segments, each light bar segment including an elongated body having a first end, and a second end;
at least one lighting unit that is secured to each of the plurality of light bar segments and is configured to be connected to a power supply;
an expansion adaptor that is configured to connect two of the plurality of light bar segments together telescopically; and
at least one endcap that is removably secured to one of the plurality of light bar segments, each of the at least one endcap being constructed to be electrically nonconductive,
wherein the elongated body of each of the plurality of light bar segments includes a hollow interior, and each of the first and second ends include openings for accessing the hollow interior,
wherein the expansion adaptor comprises an elongated shaft having a pair of ends and a center point, and
wherein the elongated shaft includes a size that is complementary to a size of the hollow interior, and each of the pair of ends of the elongated shaft are configured to be positioned within the opening located on the second end of each of the plurality of light bar segments.

* * * * *